United States Patent [19]

Folk et al.

[11] Patent Number: 4,707,722

[45] Date of Patent: Nov. 17, 1987

[54] LASER MARKING METHOD AND ABLATIVE COATING FOR USE THEREIN

[75] Inventors: Lee E. Folk, Phoenix; Reginald K. Asher, Scottsdale, both of Ariz.

[73] Assignee: Motorola, Inc., Schaumburg, Ill.

[21] Appl. No.: 4,779

[22] Filed: Jan. 9, 1987

Related U.S. Application Data

[60] Continuation of Ser. No. 820,052, Jan. 21, 1986, which is a division of Ser. No. 682,129, Dec. 17, 1984.

[51] Int. Cl.$^4$ .......................................... H01L 23/06
[52] U.S. Cl. ...................................... 357/67; 357/65; 357/74; 357/71; 357/68
[58] Field of Search ...................... 357/67, 71, 68, 65; 427/305, 304, 53.1; 174/52 FP

[56] References Cited

U.S. PATENT DOCUMENTS 4,233,107 11/1980 Johnson .............................. 427/305

OTHER PUBLICATIONS

Johnson–Black Electroless Nickel Surface Morphologies with Extremely High Light Absorption Capacitor—Metal Finishing—Jul. 1980, pp. 21–24.

Primary Examiner—Andrew J. James
Assistant Examiner—S. V. Clark
Attorney, Agent, or Firm—Raymond J. Warren

[57] ABSTRACT

Laser marking of metal surfaces, particularly semiconductor device packages, is accomplished by depositing an electroless nickel layer on the surface, converting the nickel surface to a form in which it is highly absorptive of radiant energy and exposing the converted nickel surface to laser energy through a mask. The resulting mark is highly resistant to abrasion and corrosion. In addition, the method is highly suitable for use with automated laser marking equipment. Furthermore, it appears that the presence of the converted electroless nickel surface in the region of welds increases the hermeticity of the welds. This is particularly useful in packages of the TO-3 type and similar types.

8 Claims, 3 Drawing Figures

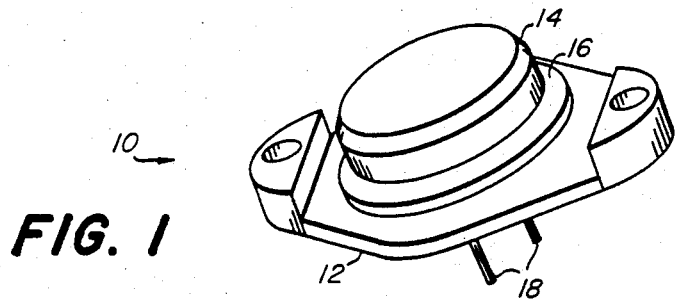
FIG. 1
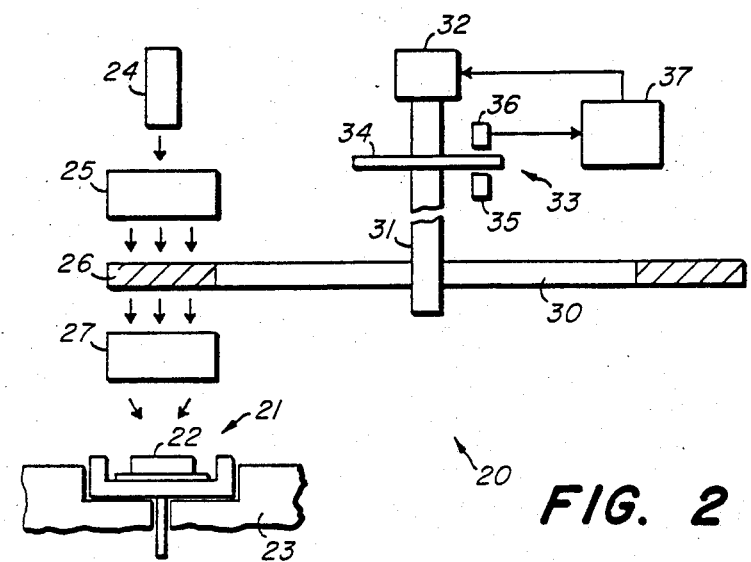
FIG. 2
FIG. 3
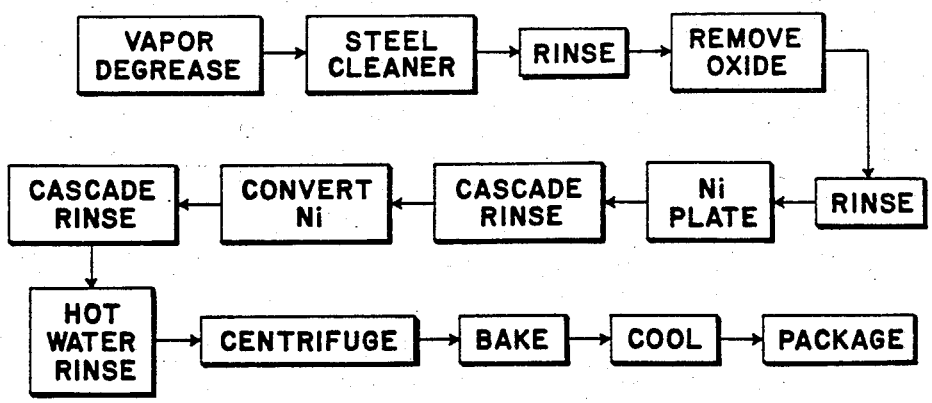

LASER MARKING METHOD AND ABLATIVE COATING FOR USE THEREIN

This is a continuation of application Ser. No. 820,052, filed Jan. 21, 1986, which is a division of application Ser. No. 682,129, filed Dec. 17, 1984.

FIELD OF THE INVENTION

The present invention relates, in general, to the marking of metal surfaces using laser energy. More particularly, the invention relates to a method of laser marking which utilizes an ablative coating deposited on the metal surface prior to marking.

BACKGROUND OF THE INVENTION

High speed, low cost marking of packages of various kinds is desirable in many applications. For instance, in the manufacture of semiconductor devices each part must be marked with a part number and is typically marked with a manufacturer's identifier. These markings are required to be resistant to corrosion and abrasion. In addition, the degree of handling required to produce the marking must be reduced to as great a degree as possible. This is of particular concern where the parts are to be marked subsequent to testing, so that only qualified parts will be marked.

The most common prior method of marking the metal surfaces of semiconductor packages utilizes ink. Tested parts are separated by lot and marked utilizing a stencil, or other process, with a wet ink. This ink must then be cured for a period of time. Not only does this process involve several stages of handling, but the resulting mark may be removed by abrasion.

More recently, the use of laser energy which exposes the surface to be marked through a mask has been used in the marking of semiconductor packages and similar articles. Typically, an ink which is ablated by the laser energy is applied. Other means of laser marking have also been implemented. However, there still exists a need for a very low cost laser marking method which produces a high quality, abrasion resistant mark at as low a cost as possible.

SUMMARY OF THE INVENTION

Accordingly, it is an object of the present invention to provide an improved laser marking method.

A further object of the present invention is to provide a high quality, low cost laser marking method which is suitable for marking on metal surfaces of semiconductor device packages.

Yet a further object of the present invention is to provide an improved coating to be applied to metal surfaces which is alterable by exposure to laser energy and which thereby produces a high quality mark.

These and other objects and advantages of the present invention are provided by a process in which a metal surface, such as portions of the metal package for a semiconductor device, is coated with a nickel layer by an electroless nickel plating process; the resulting nickel layer is blackened by exposure to an acid solution, thus rendering it highly absorptive of laser energy; and portions of the blackened layer are vaporized, or ablated, by exposure to laser energy through a mask. The shiny metal surface shows through the blackened layer in those areas in which the ablative layer has been removed, leaving a high quality mark which is resistant to abrasion and corrosion. The process is suitable for use with automated, high speed laser marking apparatus. Furthermore, the nickel coating is relatively inexpensive.

These and other objects and advantages of the present invention will be apparent to one skilled in the art from the detailed description below taken together with the drawings.

BRIEF DESCRIPTION OF THE DRAWINGS

FIG. 1 is a perspective view of a typical metal semiconductor package of the TO-3 type;

FIG. 2 is a cross sectional, simplified view of a typical laser marking apparatus; and FIG. 3 is a flow chart illustrating a process according to the principles of the present invention.

DETAILED DESCRIPTION OF THE INVENTION

FIG. 1 illustrates a semiconductor package 10 typical of the type to which the laser marking process of the present invention is particularly applicable. Package 10 is of the type commonly referred to as a TO-3 package and is used most commonly for discrete semiconductor devices which dissipate relatively large amounts of power. A metal heat sink 12 forms the base of package 10. A metal cap 14 rests on heat sink 12 and is welded thereto around a rim 16. A semiconductor device which is not visible in FIG. 1 is bonded to heat sink 12 under cap 14. Leads 18 penetrate heat sink 12 and provide the means for electrical connection to the semiconductor device.

Cap 14 serves several functions in package 10. First, it covers and protects the semiconductor device inside package 10. The weld at rim 16 is typically hermetic, as are the locations at which leads 18 penetrate heat sink 12. This provides protection for the device from corrosive atmospheres and the like. A further function of cap 14 is to carry a marking by which both the manufacturer of the part and the indentity of the part are conveyed to the user.

In most instances, the final test of the part enclosed in package 10 is performed subsequent to the packaging operation. Thus, it is not known whether the part is suitable for shipment until after it is packaged. As a result, the marking process is usually delayed until the good parts have been separated so that only they may be marked. Thus, any suitable marking process musts be useful for packaged parts and must require as little handling of the package as possible.

FIG. 2 illustrates a laser marking apparatus 20 with which semiconductor packages 21 may be readily marked. Such marking machines are common in the industry and many modifications to the apparatus shown in FIG. 2 will be apparent. A packaged device 21 includes a cap 22 which has been prepared according to a process described below. Any metal surface may be prepared according to the process below, so that the present invention is not limited to the use of the semiconductor packages having a cap 22. Most commonly, cap 22 is made of steel. Device 21 is held in a fixture 23 in a position suitable for marking.

A laser 24 provides the energy required for marking. Many lasers are suitable for this purpose. In particular, a carbon dioxide laser available from the Lumonics Corporation is suitable. This laser produces approximately 200 pulses per second and each pulse contains approximately three Joules of energy. The beam from laser 24 is expanded and colimated by an optical apparatus 25. This is necessary so that the laser energy illuminates the entirety of a mask 26. Mask 26 is a metal mask produced by familiar techniques which contains a positive image of the marking to be applied to part 21. Once the laser energy has passed through mask 26 an optical apparatus 27 reduces the size of the image and focuses it on cap 22 of part 21. In a particular embodiment of the present invention, mask 26 contains an image approximately four times the size of the mark desired on part 21, so that optical apparatus 27 produces a 4:1 reduction is size. It is found that approximately ten milliseconds of exposure to energy from laser 24 is sufficient to mark part 21. This will vary depending on variations in the process described below and on the power of laser 24.

It is commonly desirable that laser marking apparatus 20 be capable of marking more than one type, or lot, of parts. To this end, mask 26 is one of a plurality of masks carried on the rim of a disk 30. Disk 30 is attached at its axis to a shaft 31, whereby rotation of shaft 31 moves the various masks into position for exposure. A motor 32 imparts rotation to shaft 31 and thereby to disk 30. In an automated, integrated testing and marking apparatus, it will be known which of the several available marks are to be applied to a particular part 21. This information is known to controller 37 which is monitoring and controlling the functioning of the apparatus. Alternatively, the information may be input to controller 37 by a human operator. Controller 37 receives information determinative of the angular position of shaft 31 from an encoding apparatus 33. Encoding apparatus 33 comprises a disc 34 attached to shaft 31, a light source 35 on one side of disk 34 and a photoreceptor 36 on the opposite side of disk 34. As is familiar in the art, the rotation of disk 34 causes variations in the light received by photoreceptor 36 which are converted to electrical signals which may be interpreted by controller 37 to determine the angular position of shaft 31. This, of course, is determinative of which mask is currently in position for exposure. Based on this information, controller 37 provides input to motor 32 to place the desired mask 26 in position for exposure. Typically, disk 34 is constantly rotating at a constant rate. In this case, controller 37 merely times the firing of laser 24 to coincide with the location of the desired mask 26 over part 27.

In order that laser marking apparatus 20 of FIG. 2 be useful for marking semiconductor parts, cap 22 must be made sensitive to laser energy in some fashion. The process described with reference to FIG. 3, is particularly suitable for rendering cap 22 photosensitive and is the preferred embodiment of the present invention. It is intended that the described process be carried out before the caps are welded to the heat sink in the packaging operation. Various modifications will be apparent to adapt this process to other types of packages or other surfaces to be marked.

The process described with reference to FIG. 3 is particularly suitable for sensitizing steel surfaces. Various modifications in the process to adapt it to other metal surfaces will be apparent to those skilled in the art.

First, the steel cap is treated to clean it by means of a vapor degreasing operation and the application of a steel cleaner. After the caps are rinsed to remove the steel cleaner, any native oxides present on the steel are removed by the application of a dilute acid bath. Dilute acids such as sulfuric acid are suitable for this purpose. A second rinse is applied to remove the dilute acid.

The next step in the process involves the deposition on the steel surfaces of a nickel layer. In the preferred embodiment of the present invention the nickel layer is deposited by means of an electroless nickel plating solution. Various electroless nickel plating solutions are commercially available and their use is well known in the art. It is found that solutions of the type described a medium phosphorus, low corrosion resistant electroless nickel phosphorus solutions are most suitable for the practice of the present invention. Such solutions are available under the trade names of Allied Kelite 795 and Fidelity 4885. Many other similar electroless nickel plating solutions will be suitable for the practice of the present invention. The nickel plating process takes place in a solution at 90° C. or thereabouts. The caps are totally immersed in the plating solution and are agitated during the process to assure an even and continuous nickel layer. It has been found that approximately 20 minutes, ±5 minutes, produces a suitable layer of nickel on steel caps. The resulting nickel layer is approximately 200 microinches in thickness. Relatively wide variation in the thickness of the nickel layer is allowable as long as the layer is sufficiently thick to be durable.

After nickel plating the caps are subjected to a cascade rise of three stages to remove all traces of the electroless nickel plating solution.

Next, the nickel layer just deposited is converted to a form which is highly absorptive of the laser energy. This is accomplished be means of an acid bath comprising approximately 75% by volume acetic acid, approximately 25% by volume nitric acid and approximately 0.2% by volume wetting agent. In a particular embodiment of the present invention. The wetting agent is Igepal. The acid bath is maintained at approximately 20° C. It has been found that approximately 3-5 minutes immersion in the acid bath converts the upper 10-20 microinches of the nickel layer to an optically black surface, leaving a reflective metal surface beneath it.

Subsequent to conversion of the nickel layer, the caps are again subjected to a three stage cascade rinse, then to a hot water rinse and to a centrifuge to dry the caps.

The caps are then in a condition suitable for marking. However, it has been found that the durability of the converted nickel layer can be improved by baking. A one hour bake in air at 200° C. has been found suitable. In addition, a 400° C. bake for 2-5 minutes is suitable. After baking the caps are cooled and are typically packaged in plastic bags with a dessicant included to ensure that the caps are clean and dry when welded to the heat sink later in the production process.

The converted nickel layer which coats the entire cap subsequent to the process described above it sufficiently resistant to abrasion and corrosion to be useful in the normal manufacturing and packaging process. In addition, it has been found that the hermeticity of the welds between the cap and the heat sink is improved. Presumably, this is related to the presence of a converted nickel coating between the steel cap and the heat sink. It is believed that the improved weld characteristics are due to the fact that the conversion process reduces the phosphorous content at the surface. It is known that phosphorous in a surface layer may decrease the quality of a weld.

In addition to the above-mentioned advantages, a metal package having a darkened nickel layer as described above will exhibit a higher emissivity, thus increasing infra-red emission and decreasing the operating temperature of the semiconductor device over packages having bright finishes.

By now it should be apparent that improved laser marking of metal surfaces is accomplished by first depositing a layer of nickel, then converting the nickel to an optically black surface by means of an acid bath, then exposing the surface to laser energy through a mask. This process provides a marking which is highly resistant to abrasion and corrosion, yet is suitable for use with high volume laser marking machinery. In addition, it requires no curing as is the case with ink markings.

What is claimed is:

1. A semiconductor device package comprising:
   at least one metal surface;
   a layer of nickel coating said at least one metal surface, said layer of nickel having an upper portion converted to a radiant energy absorptive form, said upper portion defining an opening therethrough exposing a lower nonconverted portion of said layer of nickel.

2. A package according to claim 1 wherein:
   said upper portion of said layer of nickel comprises an electroless nickel layer which has been exposed to an acid solution.

3. A package according to claim 2 wherein said acid solution comprises:
   nitric acid; and
   acetic acid.

4. A package according to claim 1 wherein said upper portion of said layer of nickel is approximately 10-20 microinches in thickness.

5. A package according to claim 1
   wherein the opening defined by said upper portion of said layer of nickel was created by removing a portion of said upper portion of said layer of nickel by exposure to radiant energy.

6. A semiconductor device package comprising:
   a substrate having a first surface;
   an inner portion of a nickel layer having a first surface and a second surface connected to said first surface of said substrate; and
   an upper converted portion of said nickel layer absorptive of laser energy, said upper converted portion having a first surface connected to said first surface of said nickel layer.

7. The semiconductor device package of claim 6 wherein said upper converted portion of said nickel layer defines at least one opening therethrough.

8. The semiconductor device package of claim 7 wherein the at least one opening of siad upper converted portion of said nickel layer is representative of a semiconductor device contained in said semiconductor device package.

* * * * *